US012591001B2

(12) United States Patent
Mohamed Halick et al.

(10) Patent No.: US 12,591,001 B2
(45) Date of Patent: Mar. 31, 2026

(54) METHOD OF MONITORING A HEALTH STATE OF A POWER SEMICONDUCTOR DEVICE BY MONITORING INVERTER CASE TEMPERATURE DURING STEADY STATE LOADING

(71) Applicant: ROLLS-ROYCE PLC, London (GB)

(72) Inventors: Mohamed Sathik Mohamed Halick, Singapore (SG); Prasanth Sundararajan, Singapore (SG); Viswanathan Vaiyapuri, Singapore (SG); Sivakumar Nadarajan, Singapore (SG)

(73) Assignee: ROLLS-ROYCE PLC, London (GB)

( * ) Notice: Subject to any disclaimer, the term of this patent is extended or adjusted under 35 U.S.C. 154(b) by 96 days.

(21) Appl. No.: 18/523,528

(22) Filed: Nov. 29, 2023

(65) Prior Publication Data

US 2024/0192267 A1      Jun. 13, 2024

(30) Foreign Application Priority Data

Dec. 13, 2022      (GB) ...................................... 2218689

(51) Int. Cl.
*G01R 31/28* (2006.01)
*G01R 31/26* (2020.01)

(52) U.S. Cl.
CPC ..... *G01R 31/2849* (2013.01); *G01R 31/2642* (2013.01)

(58) Field of Classification Search
CPC ............ G01R 31/2642; G01R 31/2817; G01R 31/2849; G01R 31/42; G01R 31/2601; G01R 31/307; G01R 31/2619; G01R 31/2617; G01R 31/2621; G01R 31/2637; G01R 31/327; G06F 2119/02; G01M 13/04; H02P 29/68; H02P 29/60; H01P 29/00
See application file for complete search history.

(56) References Cited

U.S. PATENT DOCUMENTS 7,988,354 B2 *  8/2011  Jansen ...................... G01K 7/16
                                                          374/185
8,103,463 B2 *  1/2012  Kalgren .................. G01D 18/00
                                                          702/182

(Continued)

FOREIGN PATENT DOCUMENTS

CN      113591336 A      11/2021
CN      113591336 B      12/2021

OTHER PUBLICATIONS

Apr. 29, 2024 Search Report issued in European Patent Application No. 23210691.4.

(Continued)

*Primary Examiner* — Vinh P Nguyen
(74) *Attorney, Agent, or Firm* — OLIFF PLC

(57) ABSTRACT

A method of monitoring health of a power semiconductor device includes: determining a steady state loading of the power semiconductor device; when it is determined that the power semiconductor device is under a steady state loading, monitoring a case temperature parameter relating to a temperature of the case of the power semiconductor device over a predetermined period, derive a normalised parameter from the monitored case temperature parameter and determine the health of the power semiconductor device based on the normalised parameter.

12 Claims, 6 Drawing Sheets

100

(56) References Cited

U.S. PATENT DOCUMENTS

| | | | | |
|---|---|---|---|---|
| 10,288,672 | B2 * | 5/2019 | Qiao | .................. G01R 31/2642 |
| 11,169,201 | B2 * | 11/2021 | Degrenne | .............. G01R 31/26 |
| 11,248,966 | B2 * | 2/2022 | Sathik | .................... G01K 7/015 |
| 11,397,209 | B2 * | 7/2022 | Akin | .................. G01R 31/2644 |
| 12,274,038 | B2 * | 4/2025 | Ristimäki | .............. H05K 7/209 |
| 2018/0017613 | A1 | 1/2018 | Qiao et al. | |

OTHER PUBLICATIONS

May 31, 2023 Search Report issued in British Patent Application No. 2218689.4.

Vanessa Smet et al. "Evaluation of Vce Monitoring as a Real-Time Method to Estimate Aging of Bond Wire-IGBT Modules Stressed by Power Cycling". IEEE Transactions on Industrial Electronics, Jul. 7, 2013, vol. 60, No. 7, pp. 2760-2770.

G. Coquery et al. "Failure Criteria for Long Term Accelerated Power Cycling Test Linked to Electrical Turn Off SOA on IGBT Module. A 4000 Hours Test on 1200A-330V Module With AlSiC Base Plate". Microelectronics Reliability, 2000, vol. 40, pp. 1665-1670.

* cited by examiner

100

300

302 — Receive operating condition parameter

304 — Normalise monitored case temperature

306 — Determine normalised temperature amplitude per cycle

308 — Determine average temperature amplitude

400

402 — Receive a new normalised parameter

404 — Determine a threshold

406 — Receive a plurality of normalised case temperature parameters from different occasions 408 — Determine relationship between normalised case temperature parameter and time 410 — Extrapolate to determine failure time 412 — Determine remaining useful life based on estimated failure time

METHOD OF MONITORING A HEALTH STATE OF A POWER SEMICONDUCTOR DEVICE BY MONITORING INVERTER CASE TEMPERATURE DURING STEADY STATE LOADING

This specification is based upon and claims the benefit of priority from UK Patent Application Number 2218689.4 filed on 13 Dec. 2022, the entire contents of which are incorporated herein by reference.

BACKGROUND

The present disclosure relates to a method of monitoring a health state of a power semiconductor device.

Power semiconductor devices are an integral part of power and propulsion systems in aerospace, marine and land-based applications. However, due to the fact that the power semiconductor devices are exposed to electrical, thermal and mechanical stresses during their operation, the failure rates of these components are common and affect reliability of the whole system.

SUMMARY OF THE DISCLOSURE

According to a first aspect there is provided a method of monitoring health of a power semiconductor device, the method comprising:

determining a steady state loading of the power semiconductor device;

when it is determined that the power semiconductor device is under a steady state loading, monitoring a case temperature parameter relating to a temperature of the case of the power semiconductor device over a predetermined period, derive a normalised parameter from the monitored case temperature parameter and determine a health state of the power semiconductor device based on the normalised parameter.

It may be that determining the health of the power semiconductor device comprises: comparing the normalised parameter to a threshold; and if it is determined that the normalised parameter is above the threshold, determine that the device is aged.

It may be that the threshold is determined based on, over a predetermined period, monitoring a new case temperature parameter relating to a temperature of the case of the power semiconductor device during steady state loading when the semiconductor device is new, derive a new normalised parameter from the monitored new case temperature parameter; and derive the threshold from the new normalised parameter.

It may be that the threshold is at least 20% above the new normalised parameter.

It may be that the method further comprises electrically isolating the power semiconductor device to protect it from damage when it is determined that it is aged.

It may be that the normalised parameter comprises a number of temperature load cycles over the predetermined period. It may be that the number of temperature load cycles is derived by applying a rainflow algorithm to the monitored case temperature parameter.

It may be that deriving the normalised parameter comprises:

during steady state loading, receive an operating condition parameter relating to an operating condition of the power semiconductor device;

normalise the monitored case temperature parameter received within the predetermined period based on the operating condition parameter;

determine a temperature amplitude for each temperature load cycle over the predetermined period, the temperature amplitude relating to a difference in magnitude in the normalised temperature across the respective temperature load cycle;

determine an average temperature amplitude over the predetermined period and using the average temperature amplitude as a part of the normalised parameter.

It may be that the operating condition parameter comprises one or more of: an operating current parameter relating to the operating current applied during the predetermined period; and an operating voltage parameter relating to the operating voltage applied during the predetermined period.

It may be that determining the health of the power semiconductor device comprises: comparing the normalised parameter to a threshold; and if it is determined that the normalised parameter is below the threshold, calculating a remaining useful life of the power semiconductor device based on the normalised parameter.

It may be that calculating the remaining useful life comprises:

monitoring a new case temperature parameter relating to a temperature of the case of the power semiconductor device when the semiconductor device is new;

derive a new normalised parameter from the monitored new case temperature parameter; and determining the remaining useful life based on a comparison of the normalised parameter to the new normalised parameter and to the threshold.

It may be that the comparison of the normalised parameter to the new normalised parameter and to the threshold comprises:

determining a plurality of normalised parameters on different occasions at different times;

deriving a relationship between the normalised parameters and times; and based on the relationship, extrapolate to determine a failure time at which the normalised parameter would rise above the threshold; and determine the remaining useful life based on the failure time.

The skilled person will appreciate that except where mutually exclusive, a feature described in relation to any one of the above aspects may be applied mutatis mutandis to any other aspect. Furthermore, except where mutually exclusive any feature described herein may be applied to any aspect and/or combined with any other feature described herein.

BRIEF DESCRIPTION OF THE DRAWINGS

Embodiments will now be described by way of example only, with reference to the Figures, in which.

DETAILED DISCUSSION OF THE DISCLOSURE

Figure 1:
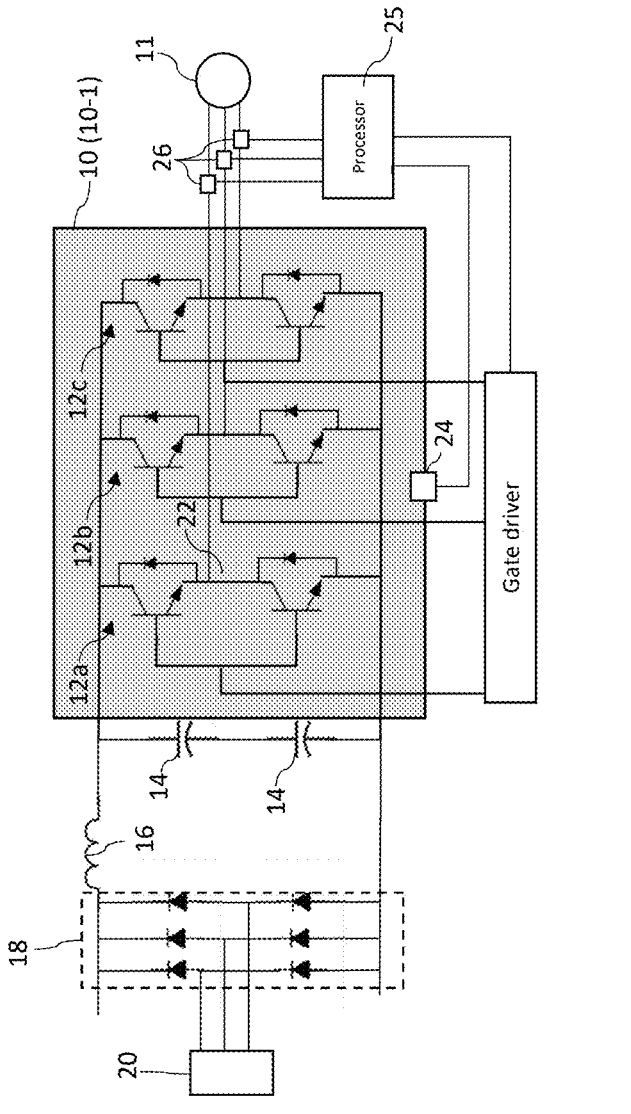
FIG. 1 is a circuit diagram showing of a power semiconductor device and circuit for monitoring it.

FIG. 1 shows a semiconductor device in the form of an inverter 10, connected to a three-phase power consuming device 11. In this example, a pair of capacitors are disposed in parallel with the inverter 10, and an inductor 16 connects the capacitors to a rectifier 18 which is configured to be connected to an AC power source 20.

In this example, the inverter 10 is a 3-phase inverter comprising six transistors 12. In this example, the transistors 12 are shown as insulated-gate bipolar transistors. In other examples, the inverter may have any suitable number of phases and a corresponding number of transistors. In other examples, the inverter may have any suitable type of transistors.

In this example, the transistors 12 are arranged in three parallel pairs, a first transistor pair 12a, a second transistor pair 12b, and a third transistor pair 12c, where each pair of transistors act in complimentary states, such that only one of a respective pair of transistors is switched on at any one time. Each phase of the three-phase power consuming device 11 is connected between a respective transistor pair 12. The inverter 10, in this example, also comprises a pair of capacitors 14 in parallel with each pair of the transistors 12a, 12b, 12c.

At least one temperature sensor 24 is disposed on a case 10-1 of the inverter 10, to monitor a case temperature parameter relating to a temperature of the case 10-1 of inverter 10.

In this example, current sensors 26 are disposed on lines to the power consuming device 11, to monitor each of the three phases of current to the power consuming device 11. In other examples, the current sensors 26 may be disposed on lines providing power to the semiconductor device 10.

A processor 25 is connected to each of the temperature sensors 24 and the current sensors 26, as is configured to receive case temperature parameters and current parameters respectively from the temperature sensors 24 and the current sensors 26.

It has been found that the case temperature, during steady state operation of a power semiconductor device 10, changes dependent on the age of the device. For example, in a new or unaged (e.g., near new and functional) semiconductor device 10, a cyclic variation in case temperature (hereinafter referred to as "case temperature amplitude") may be lower in a new or unaged semiconductor device 10 compared to an aged semiconductor device 10. In other examples, over a predetermined period of time, there may be more cycles of temperature variation in an aged semiconductor device 10 compared to a new semiconductor device 10. Therefore, the case temperature can be used to determine the health of the semiconductor device 10.

A gate driver 30 is connected to the gates of each of the transistors 12 and to the processor 25. The processor 25 is configured to trigger initiation of current monitoring by the current sensors 26 and case temperature monitoring by the temperature sensors 24, based on signals received by the gate driver 30, indicating steady state loading of the inverter 10.

It has been found that the case temperature of a power semiconductor device 10 is sensitive to operating conditions such as a load applied to the semiconductor device 10. For example, the case temperature varies dependent on the load voltage applied, the load current applied. The current sensors 26 may measure the load current, and a load voltage sensor may be connected to the power consuming device 11 or to the power source 20 providing power to the inverter 10 to measure the load voltage.

A method carried out by the processor 25 to determine a health state of the power semiconductor device 10 will be explained in more detail below with reference to FIGS. 2-6, below.

Figure 2:
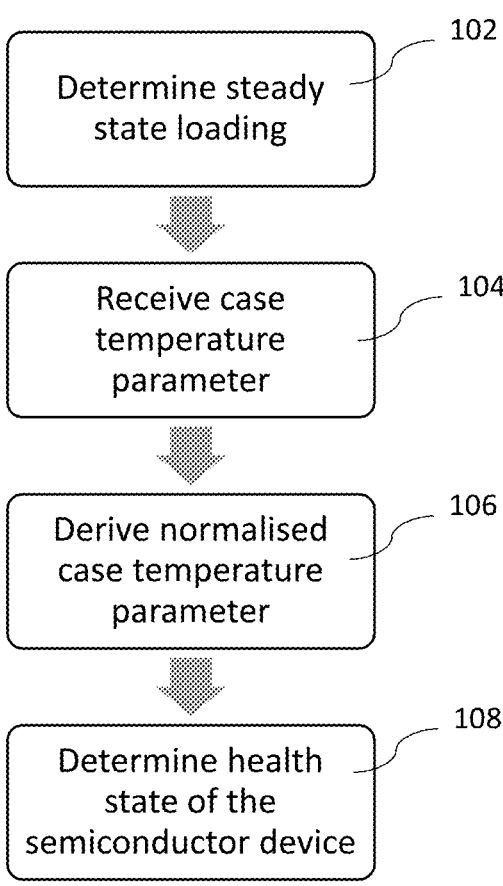
FIG. 2 is a flow chart showing steps of a method of monitoring health of the power semiconductor device.

FIG. 2 is a flow chart showing steps of a method 100 of monitoring a health state of a power semiconductor device, such as the inverter 10 in FIG. 1.

In block 102, the method 100 comprises determining a steady state loading of the inverter 10. Steady state loading may be determined by the current sensor 26 or a load voltage sensor. If a current peak or voltage peak is similar to a previous current peak or voltage peak, this indicates a steady state loading. If there is no steady state loading, the method 100 does not proceed. If there is a steady state loading, the method 100 proceeds to block 104.

In block 104, the method 100 comprises receiving a case temperature parameter, $T_C$, over a predetermined period, t, for example, from the temperature sensors 24 in FIG. 1, relating to the temperature of the case of the power semiconductor device 10 over the predetermined period, t.

During steady state loading of the semiconductor device 10, the case temperature varies cyclically, with each cycle being between a minimum temperature (at which a gradient of a temperature curve over time is zero between an earlier negative gradient and a later positive gradient) and a consecutive minimum temperature, or a maximum temperature (at which a gradient of a temperature curve over time is zero between an earlier positive gradient and a later negative gradient) and a consecutive maximum temperature.

Figure 3:
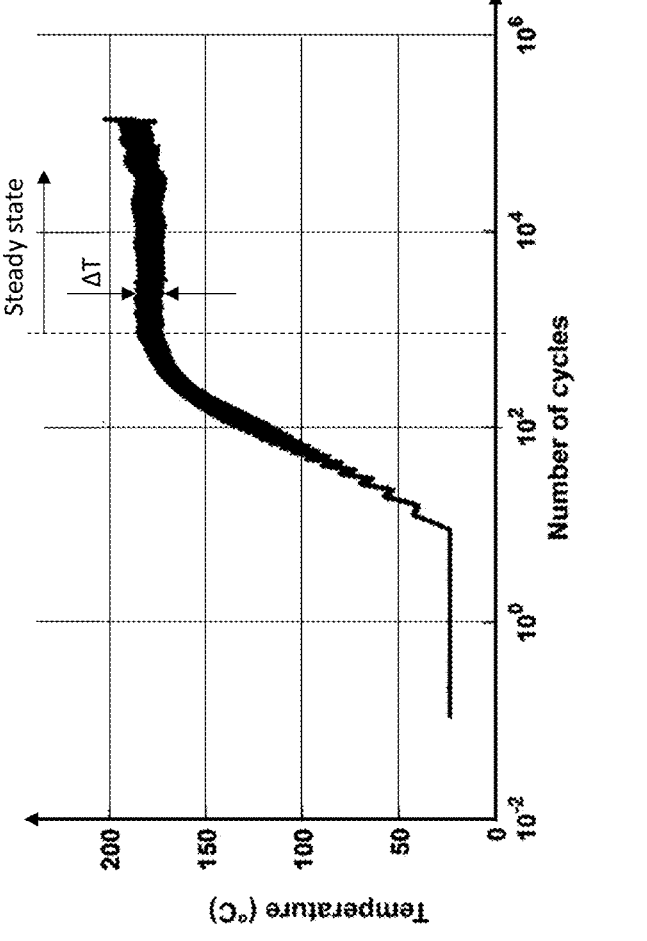
FIG. 3 is a plot of an example monitored temperature of a case of the semiconductor device over a number of temperature load cycles.

For example, FIG. 3 shows an example monitored case temperature over a period of time, with the number of load temperature cycles on the x-axis with a logarithmic scale, and the case temperature in ° C. (degrees Celsius) on the y-axis, with a linear scale. It shows that the temperature reaches a steady state at approximately 1000 load temperature cycles, and that there is a cyclic variation in temperature, $\Delta T$ (i.e., temperature amplitude) of approximately 20° C., at the steady state. Cycles of temperature variation may not be consistent, and in such circumstances a rainflow algorithm may be used to determine temperature load cycles.

Referring back to FIG. 2, in block 106, the method 100 comprises deriving a normalised case temperature parameter, $T_N$, from the case temperature parameter, $T_C$.

The normalised case temperature parameter, $T_N$, may comprise a number of temperature load cycles, $N_L$, over the predetermined time period, t. The number of temperature load cycles, $N_L$, over the predetermined time period, t, may be derived using a rainflow algorithm. The normalised case temperature parameter may comprise an average amplitude of temperature, $\Delta T_\mu$, during the predetermined time period, t (i.e., an average variation in temperature, $\Delta T$, in one temperature load cycle). The normalised case temperature parameter may comprise a combination of the temperature amplitude, $\Delta T$, and the number of temperature load cycles, $N_L$.

In block 108, the method 100 comprises determining a health state of the power semiconductor device 10, based on the normalised case temperature parameter, $T_N$.

Figure 4:
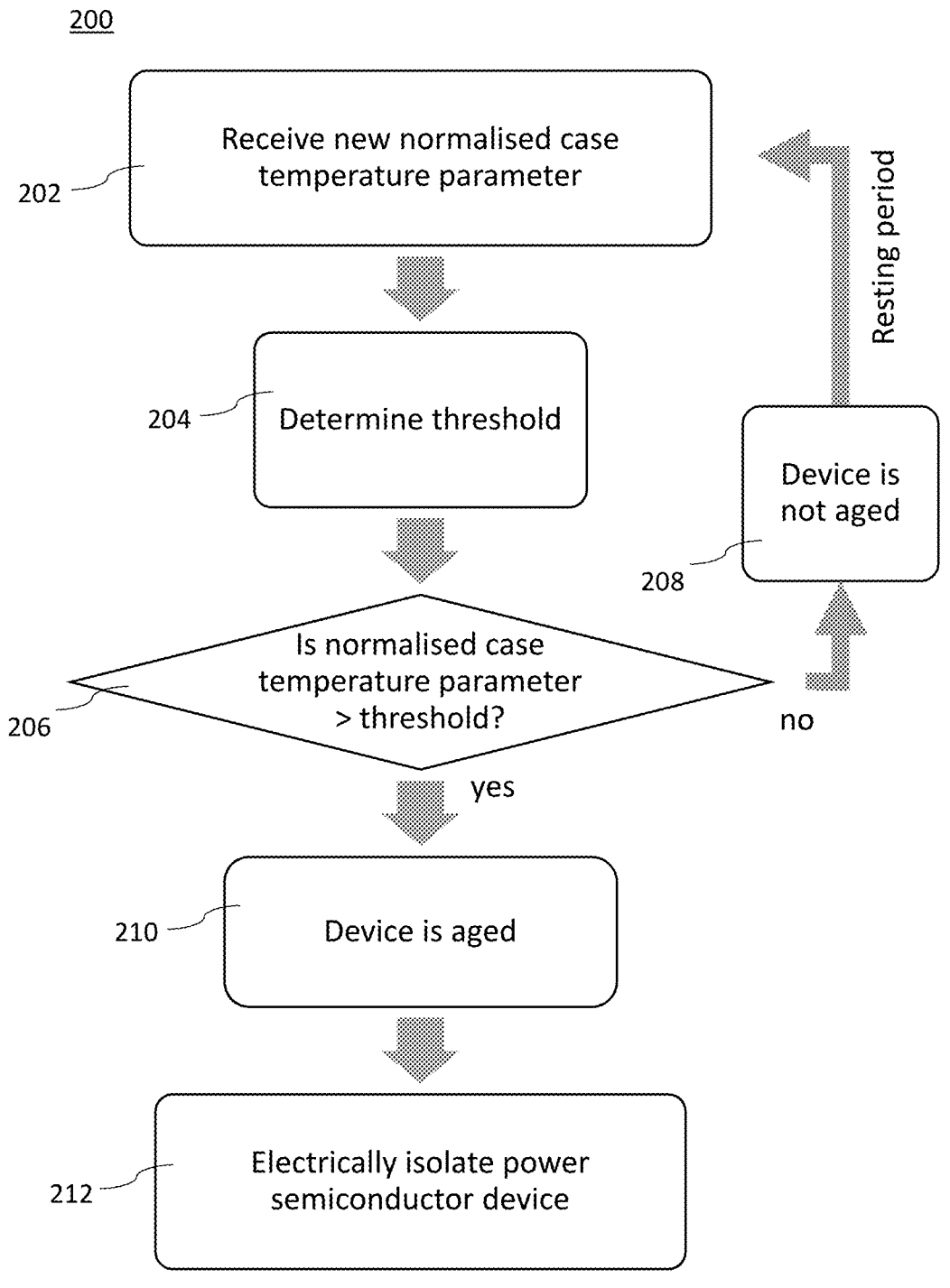
FIG. 4 is a flow chart showing more detailed steps of part of the method of FIG. 2.

FIG. 4 is a flow chart showing more detailed steps of the method 200 in block 108, to determine the health state of the power semiconductor device 10.

In block 202, the method 200 comprises receiving a new normalised parameter, $T_{N1}$, relating to a normalised case temperature parameter (for example, as determined by carrying out the steps in blocks 102-106), when the device is known to be new (or unaged). The new normalised parameter, $T_{N1}$, may be stored in a memory and may be retrieved from the memory in block 202.

In block 204, the method 200 may comprise determining a threshold, S, based on the new normalised parameter $T_{N1}$. For example, the threshold may be 20% more than the new normalised parameter, $T_{N1}$. In other examples, the threshold may be a different suitable percentage over the new normalised parameter, $T_{N1}$, such as 10%, 25% or 30%. In other examples, the threshold may be based on any suitable parameter, and the method 200 may therefore omit block 202.

In block 206, the method 200 comprises determining whether the normalised case temperature parameter, $T_N$, is above the threshold, S (is $T_N$>S?). If it is determined that the normalised case temperature parameter, $T_N$, is not higher than the threshold, S (i.e., $T_N$<S), then the method 200 proceeds to block 208, to determine that the device is not aged, and then returns to block 202, to repeat the method 200 after a predetermined resting period, and after determining a further normalised case temperature parameter, $T_N$, in blocks 102-106.

If it is determined that the normalised case temperature parameter, $T_N$, is bigger than the threshold, S (i.e., $T_N$>S), then the method proceeds to block 210, to determine that the device is aged. For example, in block 206 of FIG. 4, in the event that the normalised parameter is an average amplitude of temperature, $\Delta T_\mu$, if the average amplitude of temperature, $\Delta T_\mu$, is above a threshold average amplitude of temperature, S, the method may proceed to block 210. In other examples, in the event that the normalised parameter is number of temperature load cycles, $N_L$, over the predetermined time period, t, if the number of temperature load cycles, $N_L$, over the predetermined time period, t, is bigger than the threshold, S (i.e., $N_L$>S), then the method may proceed to block 210. In yet other examples, the normalised parameter may be a function of both the number of temperature load cycles, $N_L$, and the average temperature amplitude, $\Delta T_\mu$, and the threshold may correspond to this.

In block 212, following block 210, the method 200 may include electrically isolating the power semiconductor device 10 to protect it from damage when it is determined that it is aged.

Figure 5:
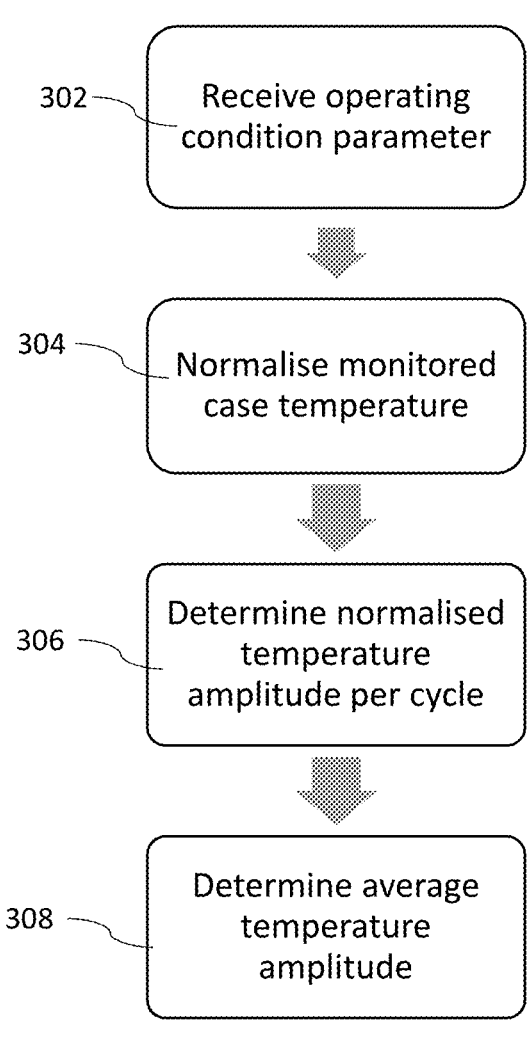
FIG. 5 is a flow chart showing more detailed steps of another part of the method of FIG. 2.

FIG. 5 is a flow chart showing steps of a more detailed method 300 in block 106, of deriving a normalised case temperature parameter, $T_N$.

In block 302, the method 300 may comprise receiving an operating condition parameter, during steady state loading (at the same time as the temperature is monitored, during the predetermined period, t), relating to an operating condition of the power semiconductor device 10. The operating condition parameter may comprise an operating current parameter relating to a load current applied to the semiconductor device 10 during the predetermined period, t. The operating condition parameter may comprise an operating voltage parameter relating to a load voltage applied to the semiconductor device 10 during the predetermined period, t. The operating condition parameter may comprise a combination of the operating voltage parameter and the operating current parameter.

In block 304, the method 300 may comprise normalising the monitored case temperature parameter received within the predetermined time period, t, based on the operating condition parameter, such as by multiplying the monitored case temperature by a correction coefficient dependent on, for example, the operating voltage parameter and the operating current parameter.

The variation in case temperature for any particular type of semiconductor device based on the load voltage or load current applied may vary. Therefore, for any particular semiconductor device type, the respective correction coefficients may be experimentally derived.

In block 306, the method 300 may comprise determining a normalised temperature amplitude, $\Delta T$, for each temperature load cycle over the predetermined period, t, the temperature amplitude, $\Delta T$, relating to a difference in magnitude in the normalised temperature across the respective temperature load cycle.

In block 308, the method 300 may comprise determining an average temperature amplitude, $\Delta T_\mu$, over the predetermined period and using the average temperature amplitude as the normalised case temperature parameter, $\Delta T_\mu$=$T_N$. In other example, the average temperature amplitude $\Delta T_\mu$ may be used as a part of the normalised case temperature parameter, for example, in combination with the number of load temperature cycles, $N_L$.

Figure 6:
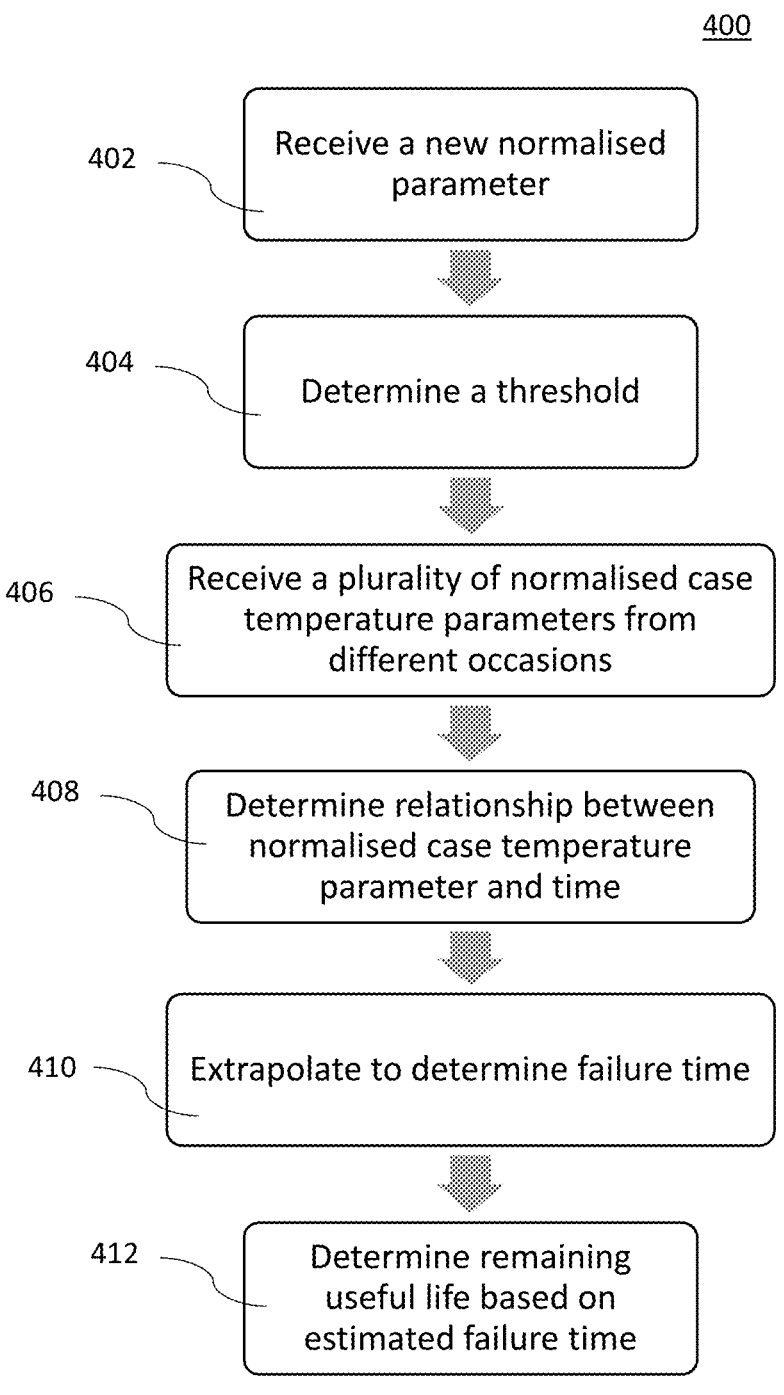
FIG. 6 is a flow chart showing more detailed steps of another part of the method of FIG. 4.

FIG. 6 is a flow chart showing a more detailed method 400 of determining that the device is not aged in block 208 of FIG. 4, which calculates a remaining useful life of the power semiconductor 10 based on the new normalised parameter, $T_{N1}$, and the threshold, S.

In block 402, the method 400 comprises receiving a new normalised parameter, $T_{N1}$, in a similar manner to block 202, for example, by retrieving it from a memory. If the method in FIG. 2 includes block 202, then block 402 may be omitted, since the new normalised parameter, $T_{N1}$, will already have been retrieved.

In block 404, the method 400 comprises determining the threshold, S, in a similar manner to block 204, based on the new normalised parameter, $T_{N1}$. As in block 204, the threshold may be calculated based on any suitable parameter, and may therefore not be based on the new normalised parameter.

In block 406, the method 400 may comprise receiving a plurality of normalised case temperature parameters, $T_{N2}$-$T_{NX}$, determined on different occasions at different times from, for example, blocks 102-106 of FIG. 2 being repeated at different times. The different normalised parameters, $T_{N2}$-$T_{NX}$, may be stored in a memory, and may be retrieved from the memory by the processor 25. The different occasions between consecutive determined normalised parameters may be separated by a resting period, which may be constant, or which may vary. The resting period may be determined by a certain number of thermal load cycles, as calculated by monitoring the temperature over time and optionally applying a rainflow algorithm, or may be determined by absolute time passing.

In block 408, the method 400 may comprise determining a relationship between the normalised parameters, $T_{N2}$-$T_{NX}$, and the times at which they were monitored. This may be, for example, by plotting the plurality or normalised parameters, $T_{N1}$-$T_{NX}$, including the new normalised parameter, $T_{N1}$, against the respective times at which they were monitored (which may be in terms of number of temperature load cycles from new, or may be in terms of absolute time), and finding a line of best fit.

In block 410, the method 400 may comprise extrapolating, based on the determined relationship, to estimate a time at which the normalised parameters would identify a failed power semiconductor device 10 (i.e., at which time the normalised parameter, $T_N$, would rise above the threshold, S), according to the determined relationship, to thereby determine a failure time.

In block 412, the method 400 may comprise determining the remaining useful life based on the estimated failure time, for example, by determining the time left between now and the estimated failure time. The remaining useful life may be output to a user interface to inform a user.

It will be understood that the invention is not limited to the embodiments above-described and various modifications and improvements can be made without departing from the concepts described herein. Except where mutually exclusive, any of the features may be employed separately or in combination with any other features and the disclosure extends to and includes all combinations and sub-combinations of one or more features described herein.

We claim:

1. A method of monitoring health of a power semiconductor device including an inverter connected to a power consuming device to supply power to the power consuming device from a power source, the inverter having a case on which a temperature sensor is provided, the method comprising:

determining a steady state loading of the power semiconductor device where a load on the inverter is determined to be steady;

when determine that the power semiconductor device is under the steady state loading, monitoring a case temperature parameter relating to a temperature of the case of the inverter detected by the temperature sensor over a predetermined period;

deriving a normalized parameter by normalizing the monitored case temperature parameter over the predetermined period; and determining a health state of the power semiconductor device based on the normalized parameter.

2. The method according to claim 1, wherein determining the health of the power semiconductor device comprises:

comparing the normalized parameter to a threshold; and if determined that the normalized parameter is above the threshold, determining that the device is aged.

3. The method according to claim 2, wherein the threshold is determined by:

when the power semiconductor device is known to be new, monitoring a new case temperature parameter relating to a temperature of the case of the inverter during steady state loading;

deriving a new normalized parameter from the monitored new case temperature parameter; and deriving the threshold to be a certain percentage over the new normalized parameter.

4. The method according to claim 3, wherein the threshold is at least 20% above the new normalized parameter.

5. The method according to claim 2, wherein the method further comprises:

upon determining that the power semiconductor device is aged, electrically isolating the power semiconductor device including the inverter from the power consuming device and the power source.

6. The method according to claim 2, wherein the normalized parameter comprises an average amplitude of the temperature of the case and a number of temperature load cycles over the predetermined period.

7. The method according to claim 6, wherein the number of temperature load cycles is derived by applying a rainflow algorithm to the monitored case temperature parameter.

8. The method according to claim 1, wherein deriving the normalized parameter comprises:

during steady state loading, receive an operating condition parameter relating to an operating condition of the power semiconductor device;

normalize the monitored case temperature parameter received within the predetermined period based on the operating condition parameter;

determine a temperature amplitude for each temperature load cycle over the predetermined period, the temperature amplitude relating to a difference in magnitude in normalized temperature across the respective temperature load cycle; and determine an average temperature amplitude over the predetermined period and using the average temperature amplitude as a part of the normalized parameter.

9. The method according to claim 8, wherein the operating condition parameter comprises one or more of:

an operating current parameter relating to an operating current applied to the inverter during the predetermined period; and an operating voltage parameter relating to an operating voltage applied to the inverter during the predetermined period.

10. The method according to claim 1, wherein determining the health of the power semiconductor device comprises:

comparing the normalized parameter to a threshold; and if determined that the normalized parameter is below the threshold, calculating a remaining useful life of the power semiconductor device based on the normalized parameter.

11. The method according to claim 10, wherein calculating the remaining useful life comprises:

monitoring a new case temperature parameter relating to a temperature of the case of the inverter when the power semiconductor device is known to be new;

deriving a new normalized parameter from the monitored new case temperature parameter; and determining the remaining useful life based on a comparison of the normalized parameter to the new normalized parameter and to the threshold.

12. The method according to claim 11, wherein the comparison of the normalized parameter to the new normalized parameter and to the threshold comprises:

determining a plurality of normalized parameters on different occasions at different times;

deriving a relationship between the normalized parameters and times;

based on the relationship, extrapolating to determine a failure time at which the normalized parameter would rise above the threshold; and determining the remaining useful life based on the failure time.

\* \* \* \* \*